United States Patent
Pinnow et al.

(10) Patent No.: US 7,214,587 B2
(45) Date of Patent: May 8, 2007

(54) METHOD FOR FABRICATING A SEMICONDUCTOR MEMORY CELL

(75) Inventors: Cay-Uwe Pinnow, München (DE); Ralf Symanczyk, München (DE)

(73) Assignee: Infineon Technologies AG, Munich (DE)

( * ) Notice: Subject to any disclaimer, the term of this patent is extended or adjusted under 35 U.S.C. 154(b) by 143 days.

(21) Appl. No.: 11/074,946

(22) Filed: Mar. 9, 2005

(65) Prior Publication Data

US 2005/0201143 A1    Sep. 15, 2005

(30) Foreign Application Priority Data

Mar. 9, 2004    (DE)    ............ 10 2004 011 431

(51) Int. Cl.
  *H01L 21/336* (2006.01)
(52) U.S. Cl. .................. 438/257; 438/197; 257/4
(58) Field of Classification Search .......... 438/197, 438/257, 585, 591, 595; 257/4, 288, 412, 257/508

See application file for complete search history.

(56) References Cited

U.S. PATENT DOCUMENTS

| | | | |
|---|---|---|---|
| 2001/0045605 A1* | 11/2001 | Miyashita et al. | .......... 257/382 |
| 2002/0168820 A1 | 11/2002 | Kozicki et al. | |
| 2003/0234397 A1 | 12/2003 | Schmid et al. | |

FOREIGN PATENT DOCUMENTS

JP    2003060090 A    2/2003

* cited by examiner

Primary Examiner—Phuc T. Dang
(74) Attorney, Agent, or Firm—Edell, Shapiro & Finnan, LLC

(57) ABSTRACT

Semiconductor memory cell and also a corresponding fabrication method are described, in which a first or bottom electrode device of the memory element of the semiconductor memory cell according to the invention and the gate electrode device of the underlying field effect transistor as selection transistor of the semiconductor memory cell are formed as the same material region or with a common material region.

12 Claims, 4 Drawing Sheets

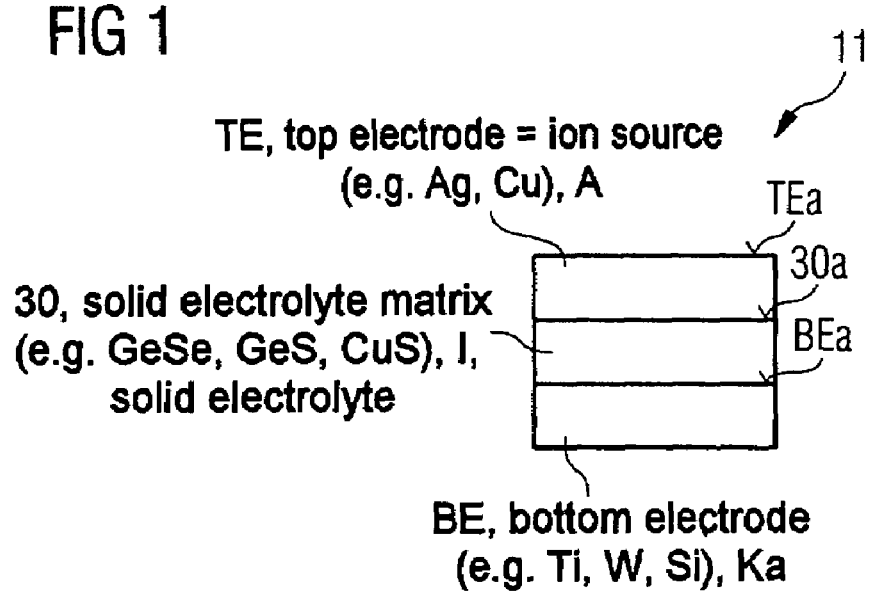
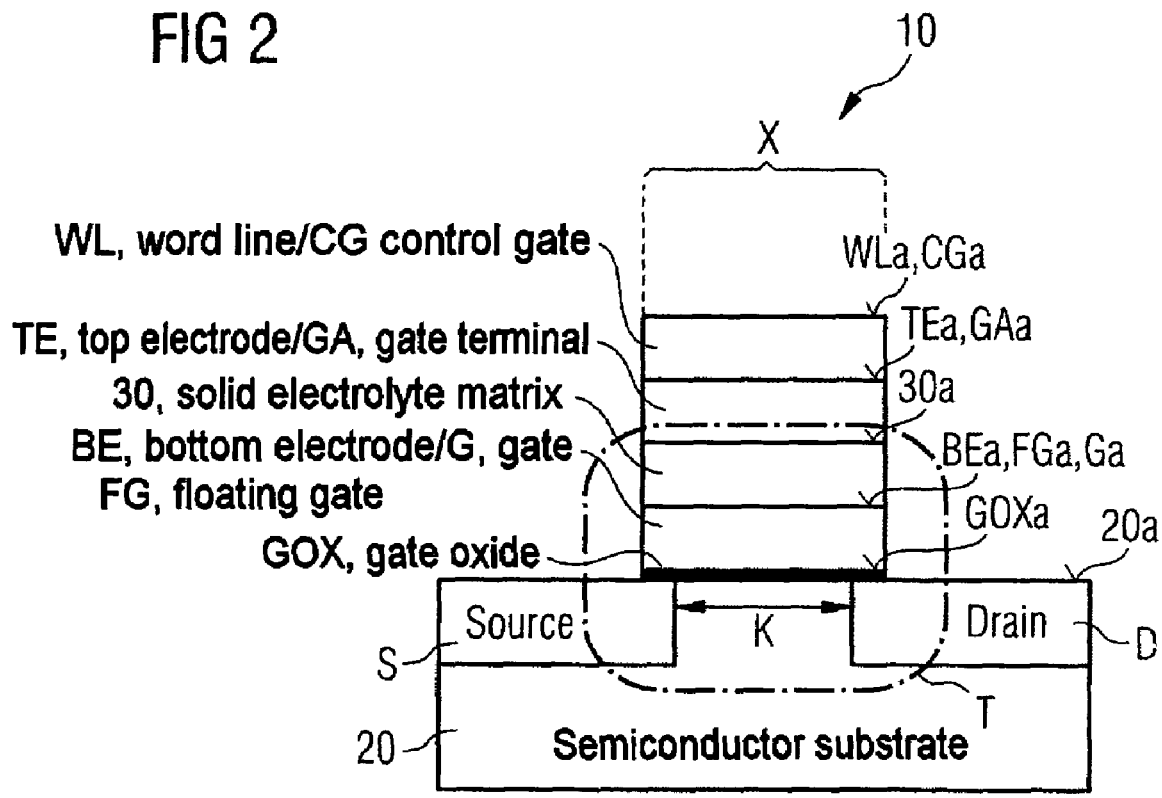

FIG 3A
Read-out method (I):
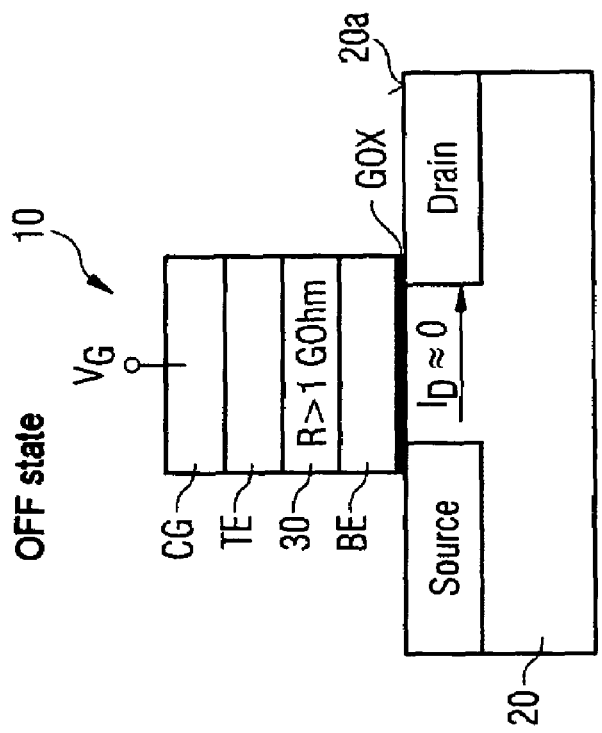
ON state
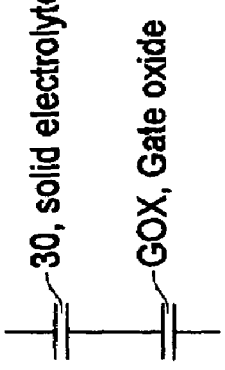
Equivalent circuit stack:
- 30, solid electrolyte
- GOX, Gate oxide
FIG 3B
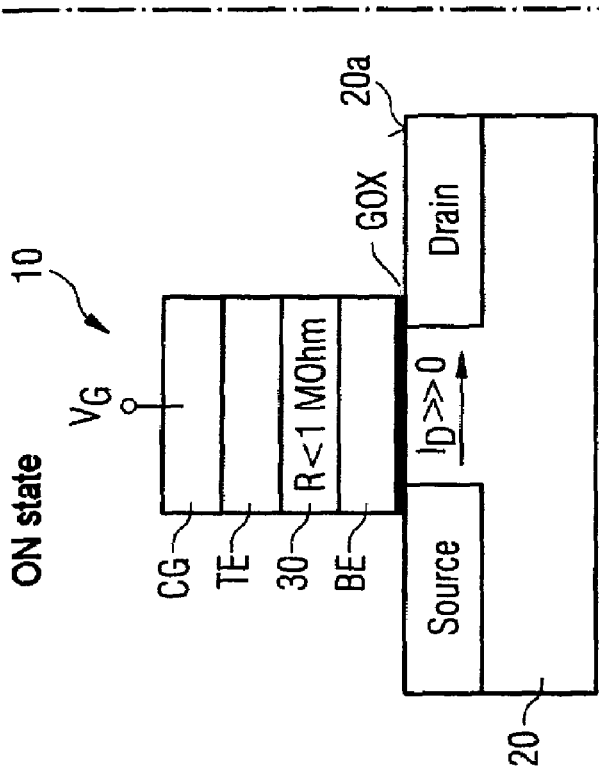
OFF state
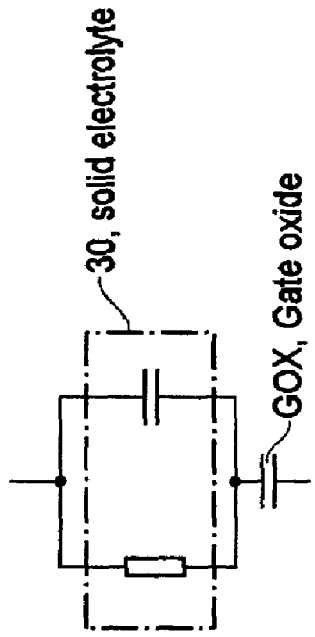
Equivalent circuit stack:
- 30, solid electrolyte
- GOX, Gate oxide

• Read-out method (II):

• Programming    • Erasure $V_G = V_{write}$,
$V_{SUB} = V_S = V_D = 0$
→direct tunneling $j_w$
→Fowler-Nordheim tunneling $j_w$ $V_G = 0$,
$V_{SUB} = V_S = V_D = V_{erase}$
→direct tunneling $j_e$
→Fowler-Nordheim tunneling $j_e$

METHOD FOR FABRICATING A SEMICONDUCTOR MEMORY CELL

CROSS REFERENCE TO RELATED APPLICATIONS

This application claims priority under 35 USC § 119 to German Application No. DE 10 2004 011 431.5, filed on Mar. 9, 2004, and titled "Method for Fabricating a Semiconductor Memory Cell," the entire contents of which are hereby incorporated by reference.

FIELD OF THE INVENTION

The present invention relates to a method for fabricating a nonvolatile semiconductor memory cell.

BACKGROUND OF THE INVENTION

Recent developments in modern semiconductor memory cells include so-called solid electrolyte memory cells, for example, nonvolatile semiconductor memory cells with a storage mechanism based on a solid electrolyte. In these and corresponding fabrication methods, the solid electrolyte region of a memory element can be formed between a first or bottom electrode device and a second or top electrode device. A field effect transistor (FET) can be formed as a selection transistor for addressing the memory element. The FET has a source region, a drain region, and a channel region. In between the source and the drain, a gate electrode device is form adjacent the channel region of the FET, and is essentially electrically insulated from the channel region by a gate insulation region. In order to realize the memory effect or storage mechanism, the solid electrolyte region is formed with different conductivity states or electrical conductivities via its controlled activation by controlled introduction of at least one activating species. It is possible for the states or conductivities to be assigned to different memory states or information states. Specifically, the assignments are based on the respective influence of the conductivity states or electrical conductivities on the conductivity of the channel region of the field effect transistor as selection transistor.

It has not previously been possible to integrate a nonvolatile semiconductor memory cell having a storage mechanism based on a solid electrolyte and its fabrication method into a customary semiconductor technology or into a corresponding fabrication method for customary semiconductor technologies without problems.

SUMMARY OF THE INVENTION

The invention provides a fabrication method for a nonvolatile semiconductor memory cell employing an integration with known structures for addressing the semiconductor memory cell, and the methods for fabrication ensure a particularly simple and reliable design.

In the case of nonvolatile semiconductor memory cells of the generic type with storage mechanisms based on a solid electrolyte, the solid electrolyte region of a memory element is formed between a first or bottom electrode device and a second or top electrode device. Furthermore, a field effect transistor is formed as a selection transistor for addressing the memory element. The field effect transistor has a source region, a drain region, and a channel region in between the source and drain, and a gate electrode device, which is adjacent to the channel region and is essentially electrically insulated from the channel region by a gate insulation region. Furthermore, the solid electrolyte region can be formed with different chemical bonds, different conductivity states, conductivities or capacitance states/capacitances by its controlled activation by controlled introduction of at least one metallic species. The different electrical conductivity states/conductivities or capacitance states/capacitances can be assigned to different memory states or information states of the memory element of the semiconductor memory cell. Specifically, the assignment is of the respective influence of the different conductivity states/conductivities or capacitance states/capacitances on the conductivity of the channel region of the underlying field effect transistor as selection transistor.

The nonvolatile semiconductor memory cell according to the invention is characterized by the fact that the first or bottom electrode device of the memory element of the semiconductor memory cell and/or the gate electrode device, in particular a floating gate electrode of the field effect transistor of the semiconductor memory cell, is formed as the same material region or with a common material region.

Consequently, a central concept of the present invention is to provide the gate electrode device, or gate electrode, or a floating gate electrode required for the selection transistor, namely for the field effect transistor, and the first or bottom electrode device for the memory element as a common material region, either as a whole or in part, thereby producing, without further additional measures, a particular spatial proximity and vicinity of the selection transistor with respect to the actual memory element that is to be addressed by the selection transistor. This also results in a particularly simple fabrication, because the same material region or a part thereof can fulfill two functions, namely, the function of the gate or the gate electrode of the selection transistor, and the function of the bottom electrode for the memory element.

In a preferred embodiment of the nonvolatile semiconductor memory cell, according to the invention, the gate electrode device, and in particular the floating gate electrode of the selection transistor or field effect transistor of the semiconductor memory cell or a part thereof has been formed as the first or bottom electrode device of the memory element of the semiconductor memory cell, or as a part thereof.

According to another embodiment, the first or bottom electrode device of the memory element of the semiconductor memory cell, or a part thereof, is formed as the gate electrode device, and in particular as the floating gate electrode of the selection transistor or field effect transistor of the semiconductor memory cell, or as part thereof.

In accordance with the methods of the present invention, a complete or partial material is produced and thus provides spatial identification between the gate electrode device of the selection transistor or field effect transistor of the semiconductor memory cell and the first or bottom electrode of the memory element of the semiconductor memory cell.

As a further embodiment, the second or top electrode device of the memory element of the semiconductor memory cell or a part thereof is formed as a gate terminal region or as the gate terminal region of the control gate electrode device of the selection transistor or the field effect transistor of the semiconductor memory cell, or as part thereof.

Furthermore, as an alternative, the method further provides the gate terminal region of the control gate electrode device of the selection transistor, or field effect transistor of the semiconductor memory cell, or a part thereof is formed as the second or top electrode device of the memory element of the semiconductor memory cell, or as part thereof.

Based upon the two methods described, what is produced is a complete or partial material, and thus spatial identification of the gate terminal region of the control gate electrode device or of the gate of the selection transistor or field effect transistor of the semiconductor memory cell with the second or top electrode device. This affords a further material and spatial integration of the memory element of the semiconductor memory cell on the basis of the solid electrolyte region with the underlying semiconductor circuit represented by the selection transistor or field effect transistor.

In another advantageous embodiment of the nonvolatile semiconductor memory cell according to the invention, the second or top electrode device of the memory element of the semiconductor memory cell is formed as source or as reservoir for at least one species that activates the solid electrolyte region.

In accordance with another additional embodiment of the nonvolatile semiconductor memory cell according to the invention, ions, in particular metal or silver ions, preferably silver cations, are provided as at least one species that activates the solid electrolyte region, and that the second or top electrode device is formed as an ion source or as ion reservoir.

In accordance with a further preferred embodiment of the nonvolatile semiconductor memory cell according to the invention, the second or top electrode device is formed from or with a material or an arbitrary combination of materials from the group consisting of copper, tungsten and silver, in particular as a double layer, preferably with silver at the bottom.

In accordance with an additional embodiment of the semiconductor memory cell according to the invention, the gate electrode device of the selection transistor or field effect transistor is formed as the floating gate, and the second or top electrode device is formed as the control gate. As an alternative to this, the function of the control gate is not performed by the top electrode itself, but rather by a material region adjoining the latter, e.g., in the form of a metal. This material region may also be a word line provided for the semiconductor memory cell.

A further aspect of the present invention provides a semiconductor memory device having a plurality of nonvolatile semiconductor memory cells according to the invention.

A further aspect of the present invention provides a method for fabricating a semiconductor memory cell according to the invention.

In the case of the method of the generic type for fabricating a nonvolatile semiconductor memory cell with a storage mechanism based on a solid electrolyte, as a memory element, a solid electrolyte region is formed between a first or bottom electrode device and a second or top electrode device. Furthermore, a field effect transistor having a source region, a drain region, a channel region, in between, and a gate electrode device, which is adjacent to the channel region and is essentially electrically insulated from the channel region by a gate insulation region, is formed as selection transistor for addressing the memory element. Furthermore, the solid electrolyte region is provided such that it can be formed or is formed with, in particular in different chemical bonds, different electrical conductivity states/conductivities or electrical capacitance states/capacitances of its controlled activation by controlled introduction of at least one activating and in particular metallic species, which different electrical conductivity states/conductivities or electrical capacitance states/capacitances can be assigned to different memory states or information states, to be precise by the respective influence of the electrical conductivity states/conductivities or electrical capacitance states/capacitances on the conductivity of the channel region of the selection transistor as field effect transistor.

The method according to the invention for fabricating a nonvolatile semiconductor memory cell is characterized by the fact that the first or bottom electrode device of the memory element of the semiconductor memory cell and/or the gate electrode device, and in particular, and/or the floating gate electrode of the selection transistor or field effect transistor of the semiconductor memory cell, are formed as the same material region or with a common material region.

Consequently, a central concept of the present fabrication method according to the invention is to materially identify the first or bottom electrode device of the semiconductor memory cell or the gate electrode device, and in particular the floating gate electrode of the selection transistor or field effect transistor of the semiconductor memory cell, at least in part or completely with one another in order thereby to achieve a particularly high spatial integration in conjunction with a simplified fabrication method.

In an advantageous embodiment of the fabrication method according to the invention, the gate electrode device, and in particular the floating gate electrode of the selection transistor or field effect transistor of the semiconductor memory cell or a part thereof, is formed as the first or bottom electrode device of the memory element of the semiconductor memory cell or as part thereof.

As an alternative to this, the first or bottom electrode device of the memory element of the semiconductor memory cell or a part thereof is formed as the gate electrode device and in particular as the floating gate electrode of the selection transistor or field effect transistor of the semiconductor memory cell or as part thereof.

In accordance with these two measures, the gate electrode device, and in particular the floating gate electrode and the bottom electrode device are materially and spatially identified in part or completely with one another.

In accordance with a further preferred embodiment of the fabrication method according to the invention, it is provided that the second or top electrode device of the memory element of the semiconductor memory cell, or a part thereof, is formed as gate terminal region or as the gate terminal region of the control gate electrode device of the selection transistor or field effect transistor of the semiconductor memory cell or as part thereof.

As an alternative or in addition to this, it is provided that the gate terminal region of the control gate electrode device of the selection transistor or field effect transistor of the semiconductor memory cell, or a part thereof, is formed as the second or top electrode device of the memory element of the semiconductor memory cell, or as part thereof.

It is furthermore preferred for the second or top electrode device to be formed as source or as reservoir for the at least one species that activates the solid electrolyte region.

It is particularly advantageous if ions, in particular metal or silver ions, preferably silver cations, are provided as at least one species that activates the solid electrolyte region. In this case, it is furthermore advantageous if the second or top electrode device is formed as ion source or as ion reservoir.

In accordance with another preferred additional or alternative embodiment of the method according to the invention for fabricating a nonvolatile semiconductor memory cell, the second or top electrode device of the memory element of the memory cell is formed from or with a material or an arbitrary combination of materials from the group consisting of copper, tungsten and silver, in particular as a double layer, preferably with silver at the bottom.

In a particularly preferred embodiment of the method according to the invention, the gate electrode device of the selection transistor or field effect transistor of the semiconductor memory cell is formed as a floating gate, and that the second or top electrode device or a material region adjoining the latter, in particular, a word line or a part thereof, are formed as a control gate for the field effect transistor or selection transistor.

In a preferred embodiment of the method according to the invention, firstly, an underlying semiconductor material region, with a surface region and with source and drain regions and a channel region in between the surface region of the semiconductor material region, is provided or formed for the field effect transistor that is respectively to be formed. A sacrificial material region covering the surface region of the semiconductor material region is then formed and patterned in such a way that in the sacrificial material region, at a respectively defined location approximately corresponding to the position of the channel region, the surface region of the semiconductor material region is freed of the sacrificial material region by a cutout with a wall region and a bottom region approximately above the channel region. A sequence of material layers for the gate insulation region of the field effect transistor, for the gate electrode device of the field effect transistor, and for the first or bottom electrode device, for the solid electrolyte region, for the second or top electrode device and for the control apparatus with corresponding surface regions, is then formed in this order in such a way that at least the surface region of the sacrificial material region and the bottom region of the cutout are covered and the cutout is filled up to a level below or as far as the surface region of the sacrificial material region. The sequence of the layers outside the cutout and the sacrificial material region are then drawn back with a stop on the level of the filling in the cutout, and that the sacrificial material region is then removed.

Furthermore, it is advantageous if a spacer layer or corresponding spacer elements covering the wall region of the cutout are formed after the formation of the cutout and prior to the filling of the cutout.

Solid electrolyte memory cells with ion conductor properties are among the new technologies that are intended to be used for future memory products. In the literature they are also referred to by the designation PMC (programmable metallization cell) or PCRAM (programmable conductor RAM). They typically comprise an anode A, an ion conductor I and a cathode Ka: see FIG. 1. This is a resistively switching element (as described below), the overall conductivity of which can be assigned to a memory state.

In the case of a solid electrolyte cell, it is possible to cause metallic ions to diffuse through the ion conductor I, which generally has poor electrical conductivity, in a controlled manner by applying bipolar voltage pulses. In order to fabricate such a memory cell, materials such as, for instance, $Ge_xS_{1-x}$, $Ge_xSe_{1-x}$, Cu—S, Cu—Se or similar chalcogenide-containing compounds are generally used for the ion conductor I. In the simplest case, the metallic ions are identical to the anode material, i.e., metallic anode material is oxidized and dissolved in the ion conductor I upon application of a positive write voltage Uwrite>Uthreshold and diffuses in the direction of the cathode K under the influence of the external electric field. As soon as a sufficient number of metal ions have diffused, a low-resistance metallic bridge may form between the anode A and the cathode K, so that the electrical resistance of the memory cell greatly decreases. The ion diffusion can be controlled by the duration, the amplitude and the polarity of the electrical voltage that is impressed externally into the cell.

The problem to be solved consists of integrating this solid electrolyte cell into a standard semiconductor-based chip (evaluation and driving logic, Si, CMOS), and being able to switch and detect the state of a memory cell securely, rapidly, and reliably.

To date there have not been any commercial memory products based on the resistive programming and read-out of solid electrolyte cells.

All previous practical realizations of this memory concept are based on so-called active-in-via structures. In this case, the active material is enclosed in an etched cavity in a dielectric (e.g. $SiO_2$) as a lateral boundary between a bottom electrode and a top electrode. In order to detect the state of the cell (logic 1 or logic 0), the current is evaluated, given an applied read voltage Uread<Uthreshold.

This technology has some crucial disadvantages such as the resistances in the ON state (low-resistance) are relatively high and are on the order of magnitude of 100 kohms, in the case of the structures realized at the present time. This limits the speed at which the cells can be read. A further disadvantage relates to the absolute values of the resistances exhibiting significant fluctuations, both from cell to cell and from programming operation to programming operation. An evaluation of the read current is therefore associated with increased uncertainty and inaccuracy. An additional disadvantage relates to the case of excessively long programming pulses, or in the case of programming pulses with excessively high currents, there is a risk of programming the cell into an irreversible "hard-write" state. The cycle strength (endurance) is greatly restricted here, as well as during programming into an ON state with the lowest possible resistance.

The method described, constitutes an innovative concept for the integration of a solid electrolyte memory cell and at the same time utilizes a new method for switching and reading from the cell. The method avoids the disadvantages of the active-in-via principle with resistive read-out.

The combination of a MOS transistor with a solid electrolyte cell in the gate stack achieves a higher tolerance with regard to fluctuations of the resistance value and a faster read-out. Furthermore, a significant improvement in endurance is expected since even metallic bridges formed in weak fashion are sufficient for the ON state. At the same time, the method produces a gain cell with a very small area ($4F^2$) which utilizes all the advantages of a 1T1R cell with respect to a crosspoint architecture without the higher area requirement that is otherwise customary.

An aspect of the invention is the integration of a solid electrolyte cell into the gate stack of a MOS transistor. The metal gate or floating gate of the MOSFET in this case serves as bottom electrode for the solid electrolyte cell and the top electrode of the solid electrolyte cell serves as gate terminal. It comprises e.g. W, V, Ni, Pt. In this case, the gate oxide is chosen to be suitably thin, so that sufficient tunneling currents flow at typical gate voltages VG (direct tunneling or Fowler-Nordheim tunneling, electron tunneling current and hole tunneling current comparable, oxide thickness between 1.5 nm and 5 nm).

This construction makes it possible to read out the state of the solid electrolyte cell by way of the drain current of the transistor (off/on). This makes use of the fact that the threshold voltage of the transistor is effected at different VG depending on the state of the solid electrolyte cell (ON=low-resistance solid electrolyte cell=low VG, OFF=high-resistance solid electrolyte cell=high VG). This is brought about by the voltage division of the gate stack (series circuit of cell and gate oxide), which is dependent on the state of the solid electrolyte cell and is tolerant toward fluctuations of the absolute value of the ON resistance. The cell is programmed and erased by means of suitable voltages at substrate and gate and also the thus incipient tunneling currents via the gate oxide. Examples and more detailed descriptions of the operating modes are represented in the appendices.

A concrete embodiment of the invention provides for the solid electrolyte cell to be integrated directly into the gate stack of the transistor is described herein.

The above and still further aspects, features, and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

These and further aspects of the present invention are explained in more detail with reference to preferred embodiments on the basis of a schematic drawing.

FIG. 1 is a schematic and sectional side view of a memory element for an embodiment of the nonvolatile semiconductor memory cell according to the invention.

FIG. 2 is a schematic and sectional side view of an embodiment of the semiconductor memory cell according to the invention.

FIGS. 3A, 3B are schematic and sectional side views of an embodiment of the semiconductor memory cell according to the invention for elucidating a read-out operation of the memory cell.

DETAILED DESCRIPTION OF THE INVENTION

Figure 4:
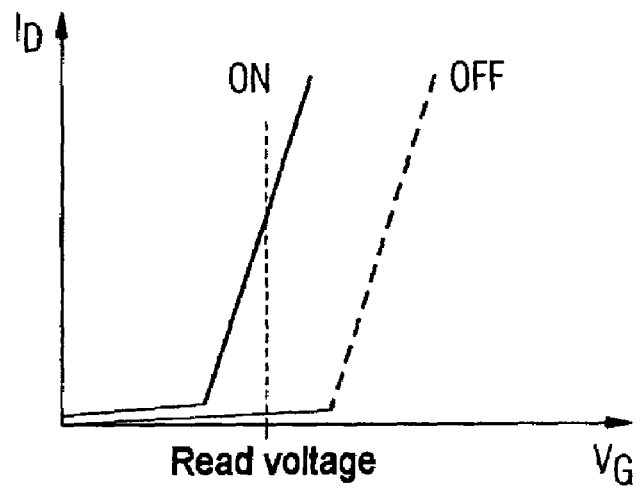
FIG. 4 shows, in the form of a graph, characteristic curves of the drain current with respect to the gate voltage for two different states stored in the memory element.

FIG. 1 shows, in schematic and sectional side view, a memory element 11 of an embodiment of the nonvolatile semiconductor memory cell 10 according to the invention. The memory element 11 illustrated in FIG. 1 comprises a first or bottom electrode BE with a surface region BEa, a solid electrolyte region 30 arranged thereon with a surface region 30a and also a second or top electrode device TE provided thereon with a surface region TEa, which simultaneously serves as ion source or ion reservoir for the solid electrolyte region 30. In the case of the embodiment of the memory element 11 illustrated in FIG. 1, the bottom electrode BE comprises, e.g., titanium, tungsten and/or silicon. The solid electrolyte matrix of the solid electrolyte region 30 comprises GeSe, GeS and/or CuS. The top electrode TE as ion source or as ion reservoir comprises or contains, e.g., Ag and/or Cu.

The memory element 11 illustrated in FIG. 1 can realize two memory states. In state 1, only little metallic material from the ion source of the top electrode TE has diffused into the matrix of the solid electrolyte region 30 via the surface 30a thereof, so that a comparatively high electrical or nonreactive resistance is established between the top electrode TE and the bottom electrode BE via the solid electrolyte region 30. In the case of the second memory state or state 2, a metallic channel has formed in the solid electrolyte region 30, to be precise, on account of the indiffusion of material from the top electrode TE. Consequently, the electrical resistance of the solid electrolyte region 30 is comparatively low.

FIG. 2 shows, in sectional side view, an embodiment of the nonvolatile semiconductor memory cell 10 according to the invention. The memory element 11 shown in FIG. 1 is provided in the case of this embodiment of the nonvolatile semiconductor memory cell 10 according to the invention. The memory element bearing on a gate insulation region or gate oxide region GOX, with the first or bottom electrode device BE on the surface region GOXa of the gate insulation region or gate oxide region. This region being adjoined by the solid electrolyte region 30 and the second or top electrode device TE and a region of a word line WL as control gate CG being situated on the surface region TEa thereof. The top electrode device TE serves as gate terminal region GA for the field effect transistor T as selection transistor T is thus formed. This selection transistor T is also based on source and drain regions S and D which are formed in the surface region 20a of the underlying semiconductor material region 20 or semiconductor substrate 20 and between which a channel region K has been formed likewise in the surface region 20a.

The bottom electrode device BE serves as floating gate FG in the embodiment of the semiconductor memory cell 10 according to the invention as shown in FIG. 2. The gate insulation region GOX or the gate oxide GOX are arranged in the region of the location X of the channel region K of the field effect transistor T on the surface region 20a of the semiconductor material region 20 and serves as the electrical insulation of the memory element 11 and in particular of the bottom electrode device BE, that is to say of the floating gate FG, from the channel region K of the field effect transistor T.

FIGS. 3A and 3B schematically show the procedure when reading from the embodiment of the semiconductor memory cell 10 according to the invention as illustrated in FIG. 2.

In the case of FIG. 3A, the semiconductor memory cell 10 is in a low-resistance state of less than one megohm, for example. This means that in the solid electrolyte region 30, on account of the indiffusion of the activating species, namely of the silver cations, for example, from the top electrode device TE serving as reservoir, metal channels form between the top electrode device TE and the bottom electrode device BE.

As a result, an essentially electrically conductive connection prevails between the control gate CG via the top electrode device TE as gate terminal GA to the bottom electrode device BE as floating gate FG, so that a substantial proportion of the gate voltage VG is present at the bottom electrode device BE and can thus be dropped across the gate insulation region GOX toward the semiconductor material region 20. Consequently, the underlying field effect transistor T as selection transistor T is in an ON state or switched-on state, so that the drain current or source-drain current ID is comparatively large. This corresponds to the equivalent circuit diagram shown in the lower region of FIG. 3A, according to which the memory element 11 is to be interpreted as finite resistance with respect to the gate capacitor of the field effect transistor T.

In the case of FIG. 3B, by contrast, the memory element 11 and hence the solid electrolyte region 30 are present in a high-resistance state of more than one gigohm, for example, so that only a small proportion of the gate voltage VG is applied to the floating gate FG, namely the bottom electrode device BE. Consequently, only a small potential difference is dropped between the semiconductor material region 20, in particular the channel region K, and the bottom electrode device BE and, therefore, the source-drain current ID is comparatively low and is almost zero, for example. The equivalent circuit diagram shown in the lower region of FIG. 3B thus results, namely the series circuit of two capacitors, namely the gate capacitor and the storage capacitor with the high-resistance solid electrolyte region 30 as insulating dielectric and the bottom electrode device and the top electrode device BE and TE, respectively, as capacitor plates.

FIG. 4, in the form of a graph, once again qualitatively elucidates the situations shown in FIGS. 3A and 3B. The graph of FIG. 4 shows the source-drain current ID as a function of the gate voltage VG, to be precise using a solid line for the low-resistance ON state illustrated schematically in FIG. 3A, and using a dashed line for the high-resistance OFF state illustrated schematically in FIG. 3B. It is apparent that when a read voltage is chosen accordingly, such as is indicated by a dashed line on the abscissa in FIG. 4, a comparatively high source-drain current ID is produced in the ON state, whereas a comparatively low source-drain current is produced in the OFF state for the same read voltage. On account of this, the memory states or information states can be assigned to the different conductivity values or conductivity states or the measured source-drain currents ID of the solid electrolyte region 30.

Figure 5:
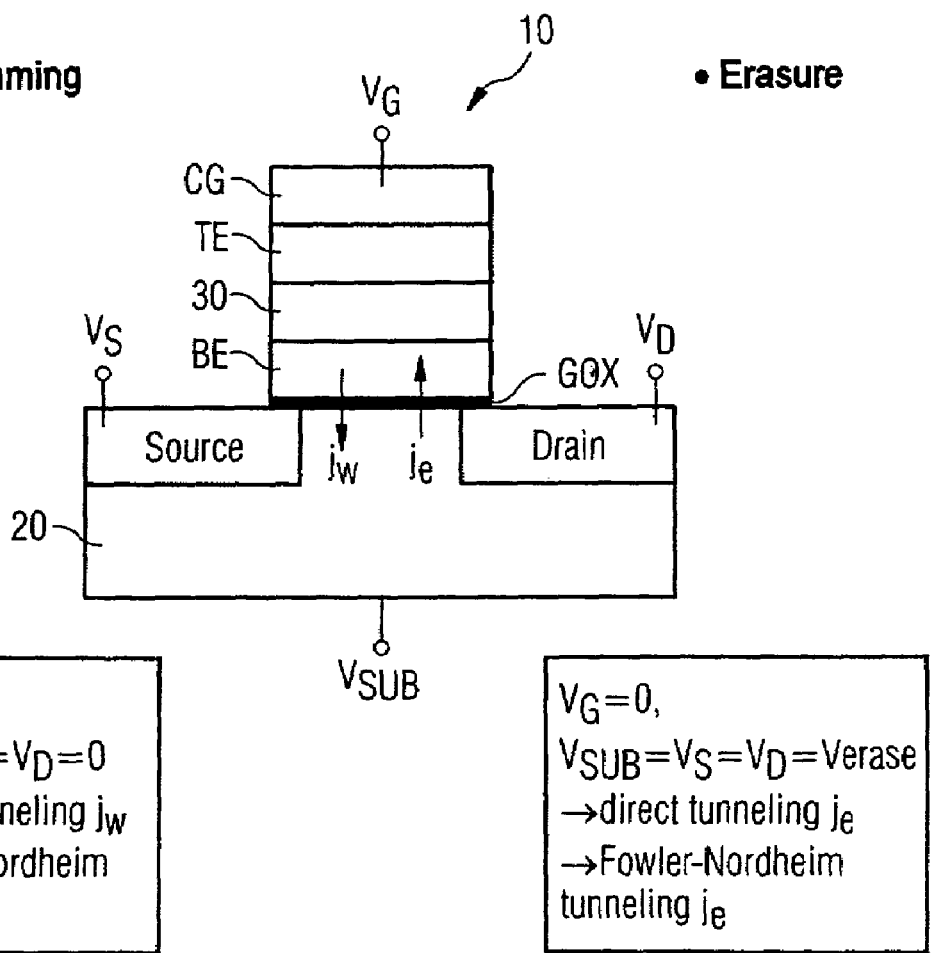
FIG. 5 schematically illustrates the programming and/or erasure of an embodiment of the nonvolatile semiconductor memory cell according to the invention.

FIG. 5 uses a schematic and sectional side view of an embodiment of the semiconductor memory cell 10 according to the invention to elucidate the operations of programming and erasure by changing the conductivity states of the solid electrolyte region 30 by controlled and supervised indiffusion or depletion of the solid electrolyte region 30 of the activating species, in particular with regard to the ions from the top electrode device TE serving as reservoir or source.

FIGS. 6A to 6D show, in the form of schematic and sectional side views, a sequence of intermediate states that are attained in the case of a preferred embodiment of the fabrication method according to the invention for a non-volatile semiconductor memory cell 10.

Figure 6A:
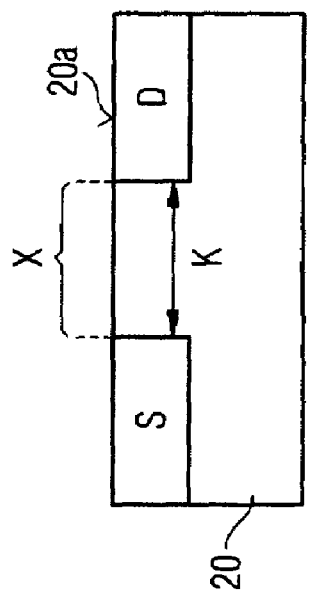
FIGS. 6A–6D show, in schematic and sectional side view, various intermediate stages that are attained in an embodiment of the fabrication method according to the invention.

In the case of the intermediate state of FIG. 6A, an underlying semiconductor substrate 20 with a surface region 20a has been provided or produced, in the surface region 20a a source region S and a drain region D being formed for the field effect transistor T as selection transistor T that is to be completed later. The source region S and the drain region D are spatially at a distance from one another, thereby defining the channel region K. The latter is thus situated at a predefined location X with respect to the surface region 20a of the semiconductor material region 20.

Figure 6B:
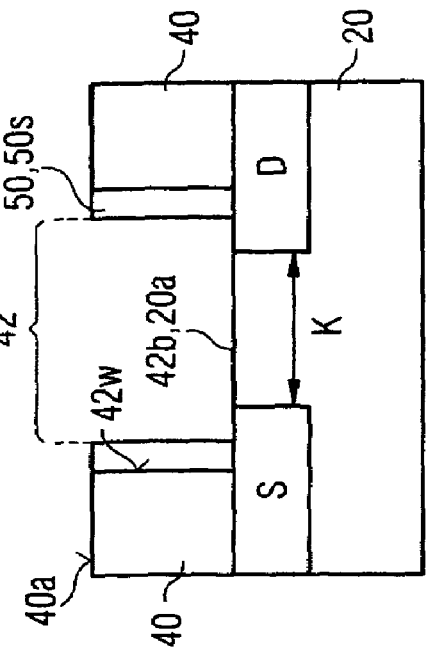

In the transition to the intermediate state shown in FIG. 6B, firstly a sacrificial material region 40 or a sacrificial layer 40 with a surface region 40a is formed by deposition. A cutout 42 having a wall region 42w and a bottom region 42b is then formed in the sacrificial material region 40 above the channel region K, that is to say at the defined location X. The cutout 42 completely penetrates through the sacrificial material region 40 in such a way that the underlying semiconductor material region 20 and the surface 20a thereof are partially uncovered in the region of the channel region K, that is to say at the defined location X. In the embodiment of the sequence of FIGS. 6A to 6D, a spacer layer 50, made of silicon dioxide, for example, is additionally formed, so that the wall region 42w of the cutout 42 is lined with spacer elements 50s.

Figure 6D:
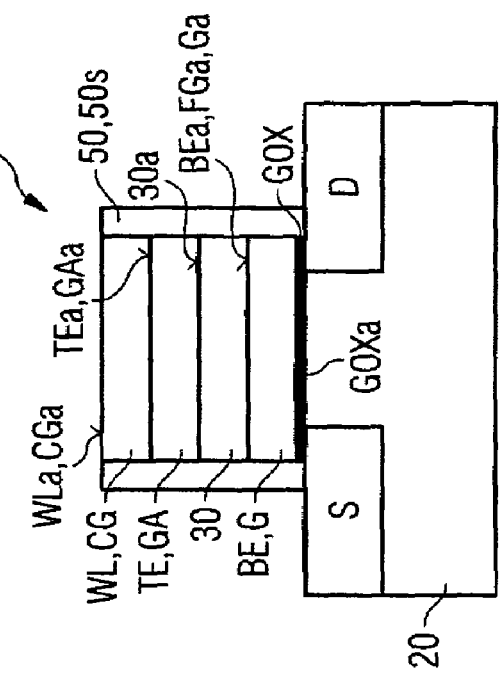
Figure 6C:
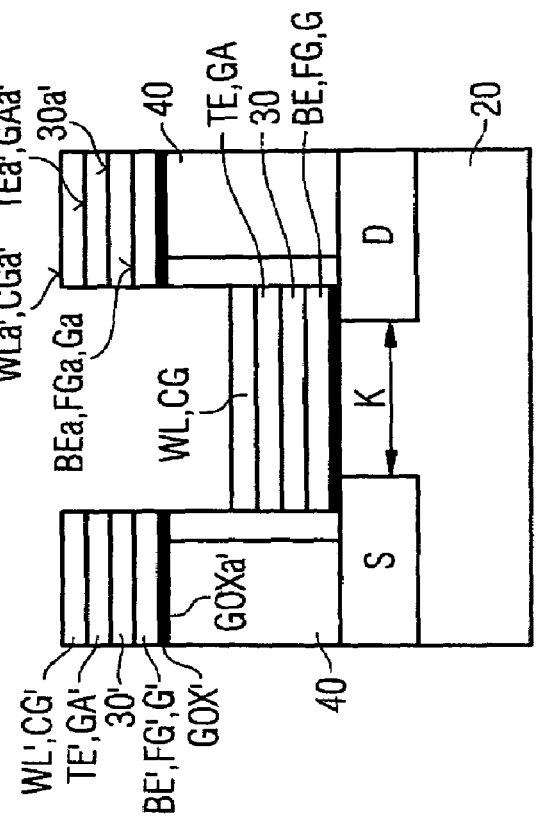

In the transition to the intermediate state shown in FIG. 6C, a sequence of layers with corresponding surface regions is then implemented, so that the surface 40a of the sacrificial material region 40 and the bottom region 42b of the cutout 42 are covered and the cutout 42 is filled up to a level which does not exceed the level of the surface region 40a.

The sequence of layers involves a layer GOX' for the gate insulation region GOX with a surface region GOXa', an adjoining layer BE' for the bottom electrode BE with a surface region BEa', an adjoining layer 30' for the solid electrolyte region 30 with a surface region 30a', an adjoining layer TE' for the top electrode device TE with a surface region TEa', and also an adjoining layer WL' or CG' for the word line WL or for the control gate CG with a surface region WLa', CGa'.

In the transition to the intermediate state shown in FIG. 6D, the sequence of material layers that was formed in the transition from the state of FIG. 6B to the state of FIG. 6C is drawn back outside the region of the cutout 42 as far as a level corresponding to the surface region CGa of the original layer WL', CG' for the word line WL or respectively for the control gate CG in the cutout 42. This may be done by means of a CMP method, for example. Afterward, the sacrificial material region 40 is then etched back in such a way that, as is illustrated in FIG. 6D, exclusively the gate insulation region GOX, the bottom electrode device BE as gate G or as floating gate FG of the selection transistor T, the solid electrolyte region 30, the top electrode device TE and also the control gate CG or the word line WL are preserved in this order as stack element with the spacer elements 50s at the side.

In particular, the semiconductor memory cell according to the invention can also be fabricated by etching methods. In this case, firstly the so-called stack is formed in large-area fashion or over the whole area, in the above-described order for the sequence of the individual material layers. The stack is then patterned by etching. The source/drain implantation then follows.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

10 Nonvolatile semiconductor memory cell according to the invention
11 Memory element
20 Semiconductor material region, semiconductor substrates
20a Surface region
30 Solid electrolyte region
30a Surface region
30' Material region for solid electrolyte region 30
30a' Surface region
40 Sacrificial material region, sacrificial layer
40a Surface region
42 Cutout
42b Bottom region
42w Wall region
50 Spacer region, spacer layer
50s Spacer element
100 Semiconductor memory device
A Anode
BE First or bottom electrode device
BEa Surface region
BE' Material layer for bottom electrode BE
Bea' Surface region
CG Control gate, control gate electrode, control gate region
CGa Surface region
CG' Material region for control gate CG
CGa' Surface region
D Drain region, drain
FG Floating gate, floating gate region, floating gate electrode
FGa Surface region
FG' Material layer for floating gate FG
FGa' surface region
FKE solid electrolyte, solid electrolyte material
G gate, gate electrode, gate electrode region
Ga surface region
GA gate terminal
GAa surface region
G' material layer for gate electrode device G
Ga' surface region
GOX gate insulation region, gate oxide
GOXa surface region
GOX' material layer for gate insulation region GOX
GOXa' surface region
I ion conductor
K channel region, channel path
Ka cathode
S source, source region
TE second or top electrode device
TEa surface region
TE' material layer for top electrode device TE
TEa' surface region
WL word line, word line device
X predefined location

What is claimed is:

1. A method for fabricating a nonvolatile semiconductor memory cell including a selection transistor and a memory element with a solid electrolyte storage mechanism, the method comprising:

forming in a surface region of a semiconductor material, source, drain, and channel regions of a field effect transistor to serve as the selection transistor;

forming a sacrificial material over the surface region of the semiconductor material with a cutout in the vicinity of the channel region, the cutout being bounded by a wall region and being substantially free of the sacrificial material;

forming in the cutout a gate insulation layer, a first electrode layer, a solid electrolyte layer, a second electrode layer, and a third electrode layer such that a top surface of the third electrode layer is below a top surface of the sacrificial material, wherein corresponding layers are formed on the top surface of the sacrificial material, and wherein the gate insulation layer serves as a gate insulator region of the field effect transistor, at least a portion of the first electrode layer serves as a gate electrode of the field effect transistor, at least a portion of the first electrode layer serves as a first electrode of the memory element, at least a portion of the second electrode layer serves as a second electrode of the memory element, and at least a portion of the third electrode serves as a control gate electrode of the field effect transistor; and removing the corresponding layers formed on the sacrificial material and removing the sacrificial material.

2. The method as claimed in claim 1, further comprising:

forming a spacer layer covering the wall region of the cutout after forming the cutout and prior to forming layers in the cutout.

3. The method as claimed in claim 1, wherein the gate electrode of the field effect transistor or a part thereof is formed as the first electrode of the memory element or as part thereof.

4. The method as claimed in claim 1, wherein the first electrode of the memory element or a part thereof is formed as the gate electrode of the field effect transistor or as part thereof.

5. The method as claimed in claim 1, wherein the second electrode of the memory element or a part thereof serves as a gate terminal region of the control gate electrode or as part thereof.

6. The method as claimed in claim 1, wherein a gate terminal region of the control gate electrode or a part thereof is formed as the second electrode of the memory element or as part thereof.

7. The method as claimed in claim 1, wherein the second electrode is formed as a source or reservoir for a species that activates the solid electrolyte region.

8. The method as claimed in claim 1, wherein metal or silver ions are provided as the species that activates the solid electrolyte region, and the second electrode is formed as an ion source or as an ion reservoir.

9. The method as claimed in claim 8, wherein the silver ions are silver cations.

10. The method as claimed in claim 1, wherein the second electrode comprises one or a combination of materials from the group consisting of copper, tungsten and silver.

11. The method of claim 10, wherein the second electrode comprises a double layer, wherein a bottom of the double layer comprises silver.

12. The method as claimed in claim 1, wherein the gate electrode is formed as a floating gate, and the second electrode or a material region adjoining the second electrode is formed as a control gate.

* * * * *